(12) United States Patent
Koike

(10) Patent No.: US 9,171,974 B2
(45) Date of Patent: Oct. 27, 2015

(54) SEMICONDUCTOR DEVICE AND METHOD OF MANUFACTURING THE SAME

(71) Applicant: KABUSHIKI KAISHA TOSHIBA, Minato-ku, Tokyo (JP)

(72) Inventor: Hidetoshi Koike, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 154 days.

(21) Appl. No.: 13/764,501

(22) Filed: Feb. 11, 2013

(65) Prior Publication Data

US 2014/0008755 A1 Jan. 9, 2014

(30) Foreign Application Priority Data

Jul. 3, 2012 (JP) ................. 2012-149486

(51) Int. Cl.
*H01L 31/0224* (2006.01)
*H01L 27/146* (2006.01)

(52) U.S. Cl.
CPC .......... *H01L 31/0224* (2013.01); *H01L 27/146* (2013.01); *H01L 27/1464* (2013.01); *H01L 27/14632* (2013.01); *H01L 27/14636* (2013.01); *H01L 27/14687* (2013.01)

(58) Field of Classification Search
CPC .............. H01L 27/1464; H01L 14/698; H01L 14/14621; H01L 14/14627; H01L 14/14636
USPC .......................................... 257/292, 432, 239
See application file for complete search history.

(56) References Cited

U.S. PATENT DOCUMENTS

2010/0155796 A1 6/2010 Koike et al.
2012/0126096 A1* 5/2012 Sugiura et al. ............. 250/208.1

FOREIGN PATENT DOCUMENTS

| JP | 2008-258201 A | 10/2008 |
| JP | 2010-147230 A | 7/2010 |
| JP | 2010-267695 A | 11/2010 |
| JP | 2010267695 A * | 11/2010 |
| JP | 2010-287638 A | 12/2010 |
| JP | 2011-003645 A | 1/2011 |
| JP | 2011-014674 A | 1/2011 |

* cited by examiner

*Primary Examiner* — Jerome Jackson, Jr.
*Assistant Examiner* — Bo Fan
(74) *Attorney, Agent, or Firm* — Holtz, Holtz, Goodman & Chick PC

(57) ABSTRACT

According to one embodiment, in a semiconductor device, a semiconductor substrate has a first surface and a second surface which is opposed to the first surface. An insulating layer is provided on the first surface of the semiconductor substrate. A metal wiring is provided within the insulating layer. A support substrate is bonded to the insulating layer. A poly silicon electrode is connected to the metal wiring through a contact. A pad is provided on the second surface of the semiconductor substrate and is connected to the poly silicon electrode through a metal film deposited in a via-hole to penetrate the semiconductor substrate and extend to the poly silicon electrode.

9 Claims, 14 Drawing Sheets

PIXEL CIRCUMFERENCE UNIT

PIXEL CIRCUMFERENCE UNIT

PIXEL CIRCUMFERENCE UNIT

PIXEL CIRCUMFERENCE UNIT

PIXEL CIRCUMFERENCE UNIT

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2012-149486, filed on Jul. 3, 2012, the entire contents of which are incorporated herein by reference.

FIELD

Embodiments described herein relate generally to a semiconductor device and a method of manufacturing the same.

BACKGROUND

As a semiconductor device containing a solid-state image sensing device, there is a back illumination complementary metal oxide semiconductor (CMOS) image sensor. In the back illumination CMOS image sensor, light enters from a back side of a substrate on which an electrode layer, a wiring layer, etc. are not disposed, the light is converted into an electric signal by a photo-diode, the electric signal is outputted to the outside of the substrate.

In the case of outputting the electric signal to the back side of the substrate, an electrode is provided on the back side of the substrate and is connected to a metal wiring layer through a via which penetrates the substrate.

Therefore, after the support substrate is bonded to the front side of the substrate on which the metal wiring layer is formed so that the substrate is reinforced, the substrate is ground from the back side so as to thin the substrate, and a via-hole is made by dry etching from the back side of the substrate. The dry etching is generally performed using a gas of fluorine system.

Accordingly, when the via-hole extends to the metal wiring layer during the dry etching, it is a problem that the metal wiring layer to which the via-hole extends is corroded by the gas of fluorine system.

DETAILED DESCRIPTION

Figure 1:
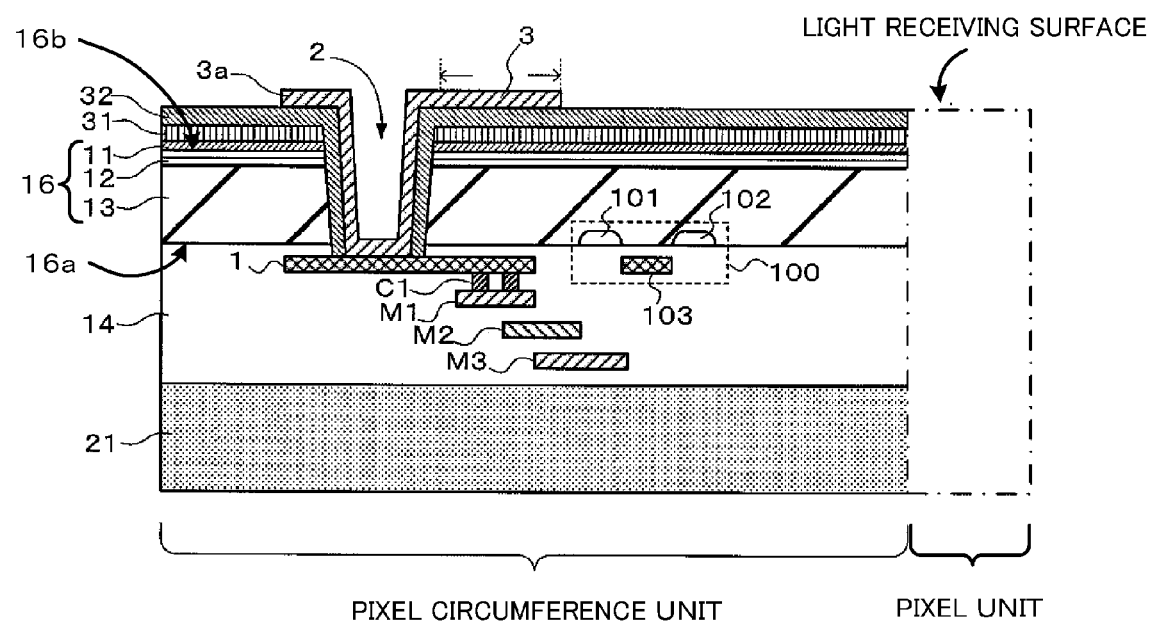
FIG. 1 is a cross-sectional view showing a main portion of a semiconductor device according to a first embodiment.

According to one embodiment, in a semiconductor device, a semiconductor substrate has a first surface and a second surface which is opposed to the first surface. An insulating layer is provided on the first surface of the semiconductor substrate. A metal wiring is provided within the insulating layer. A support substrate is bonded to the insulating layer. A poly silicon electrode is connected to the metal wiring through a contact. A pad is provided on the second surface of the semiconductor substrate and is connected to the poly silicon electrode through a metal film deposited in a via-hole to penetrate the semiconductor substrate and extend to the poly silicon electrode.

Hereinafter, embodiments will be described with reference to the drawings. In the drawings, same reference characters denote the same or similar portions.

First Embodiment

FIG. 1 is a cross-sectional view showing a semiconductor device of a first embodiment. The semiconductor device is a back-side illumination image sensor, for example. The back-side illumination image sensor has a pixel unit which includes a light-receiving surface on a back surface (second surface) 16b side of a semiconductor substrate 16, and a pixel circumference unit. The semiconductor substrate 16 is made by laminating a BOX layer (buried oxide film) 11, p+-type semiconductor layer 12 and n-type epitaxial layer 13 in the order. An insulating layer 14 is provided on a front surface (first surface) 16a side of the semiconductor substrate 16. A support substrate 21 is bonded to the insulating layer 14. The description of the pixel unit is omitted and only the pixel circumference unit will be described. In addition, FIG. 1 shows the semiconductor substrate 16 in such a manner that the back surface 16b side is upwards towards.

In the pixel circumference unit of the semiconductor device of the first embodiment, a metal wiring M1 of a first layer, a second metal wiring M2 of a second layer and a metal wiring M3 of a third layer are formed within the insulating layer 14 to which the support substrate 21 is bonded in such a manner that the metal wirings M1, M2, M3 are stacked in the order.

The semiconductor device of the first embodiment includes a poly silicon electrode 1, a via-hole 2 and a pad 3. The poly silicon electrode 1 is connected to the metal wiring M1 of the first layer through a contact C1. The via-hole 2 penetrates the semiconductor substrate 16 from the back surface 16b of the semiconductor substrate 16 and extends to the poly silicon electrode 1. The pad 3 is provided on the back surface 16b of the semiconductor substrate 16 and is connected to the poly silicon electrode 1 through a metal film 3a deposited in the via-hole 2.

Moreover, an insulated gate field effect transistor (MOSFET) 100 is provided with the pixel circumference unit. The MOSFET 100 has a source layer 101, a drain layer 102 and a gate poly silicon electrode 103 which is formed in the step of the formation of the poly silicon electrode 1.

In addition, in the semiconductor device of the first embodiment, a SiN layer 31 is formed on the BOX layer 11, and, a $SiO_2$ layer 32 is formed on the SiN layer 31 and the sidewall of the via-hole 2.

The method of manufacturing the semiconductor device will be described with reference to FIGS. 2 to 11.

Figure 2:
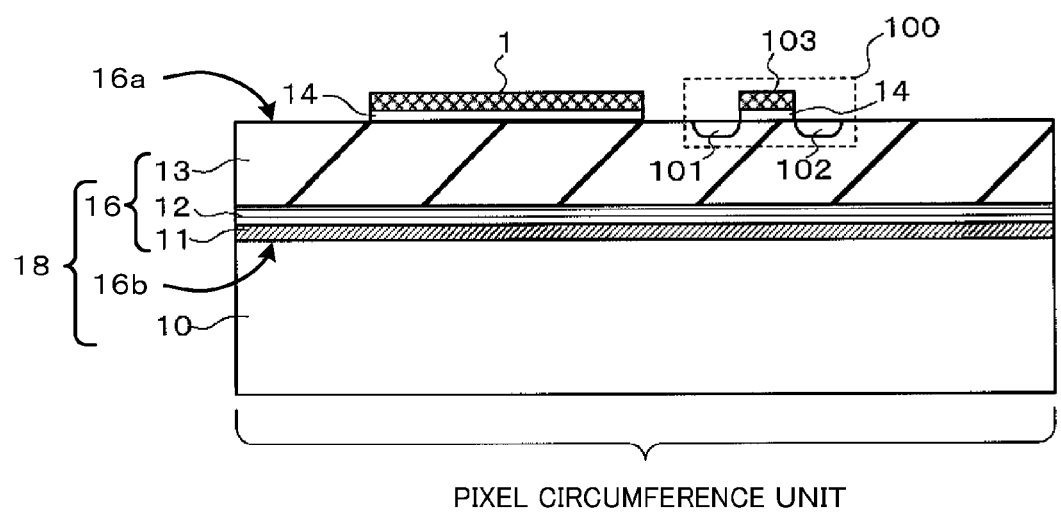
FIGS. 2 to 11 are cross-sectional views showing steps of manufacturing the semiconductor device in sequential order according to the first embodiment.

Firstly, as shown in FIG. 2, the BOX layer 11, the p+-type layer 12 and the n-type epitaxial layer 13 are formed on a silicon substrate (base substrate) 10 in the order, so that the semiconductor substrate 18 is obtained. The insulating layer 14 is further formed on the n-type epitaxial layer 13. The poly silicon electrode 1 and the gate poly silicon electrode 103 are formed on the insulating layer 14.

The source layer 101 and the drain layer 102 of the MOSFET 100 are formed by implanting impurities of ions so as to interpose the gate poly silicon electrode 103 therebetween.

Figure 3:
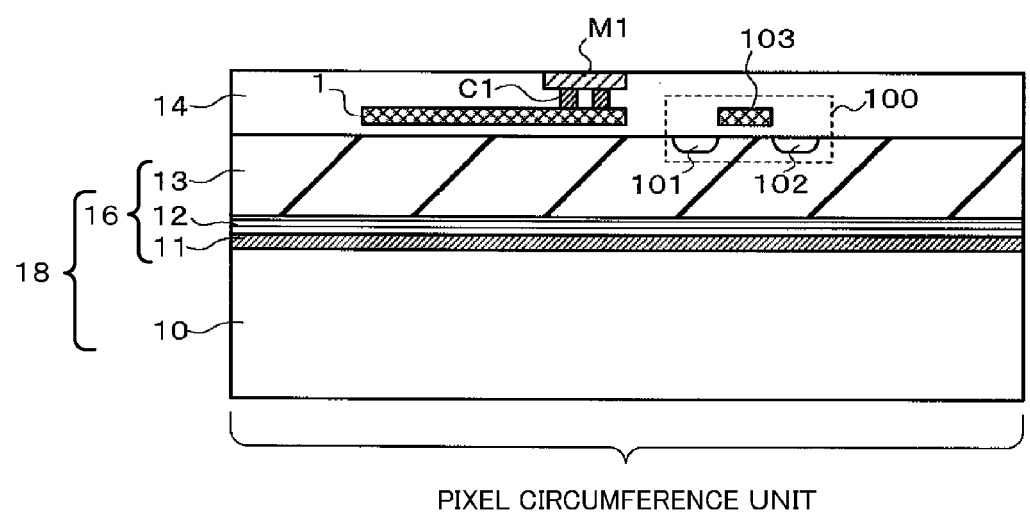

As shown in FIG. 3, the insulating layer 14 is further formed on the circumference of the poly silicon electrode 1. The contact C1 is formed in the insulating layer 14 which is on the poly silicon electrode 1. The metal wiring M1 of the first layer is formed on the contact C1.

Therefore, the poly silicon electrode 1 is connected to the metal wiring M1 of the first layer through the contact C1.

Figure 4:
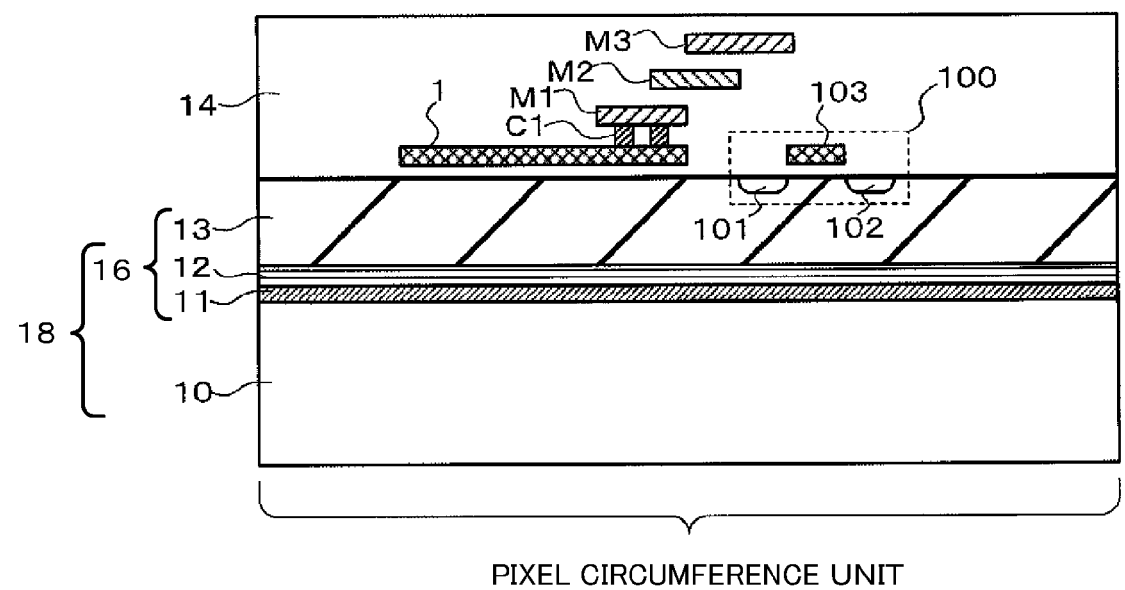

The insulating layer 14 and the metal wiring layer are alternately laminated. As shown in FIG. 4, the structure having multiple wirings is completed within the insulating layer 14 in such a manner that the metal wiring M1 of the first layer, the second metal wiring M2 of the second layer, and the metal wiring M3 of the third layer are stacked in order.

Figure 5:
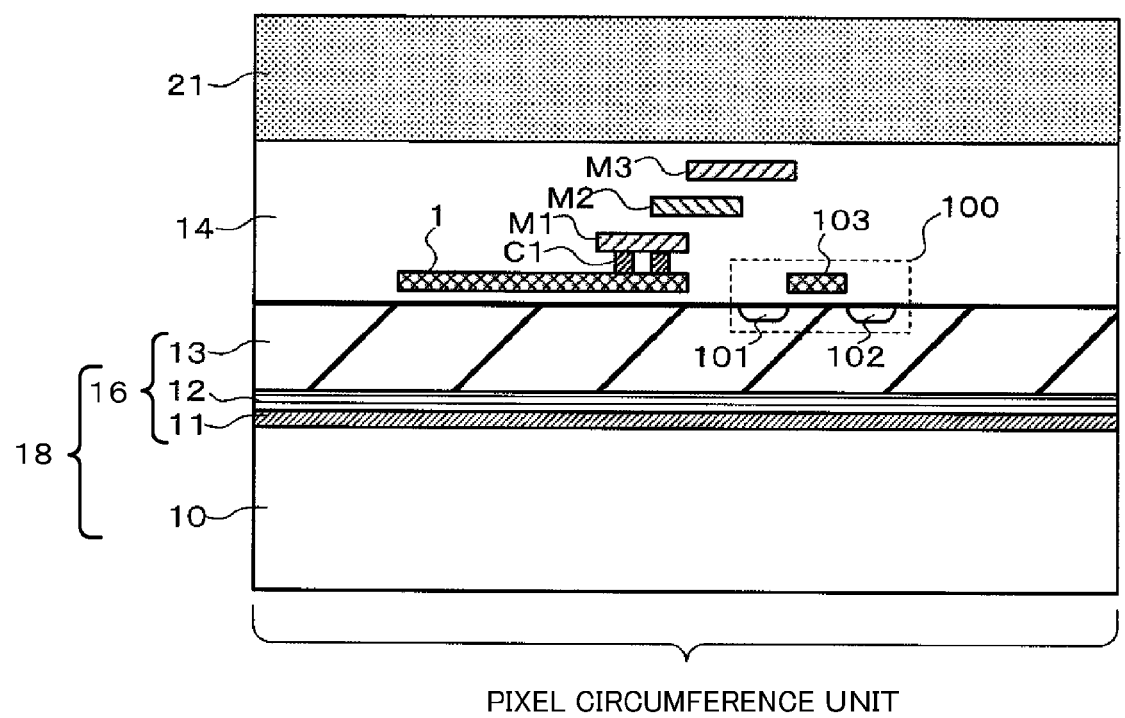

As shown in FIG. 5, the support substrate 21 is bonded to the insulating layer 14. The bonding is performed using a low temperature direct bonding method.

Figure 6:
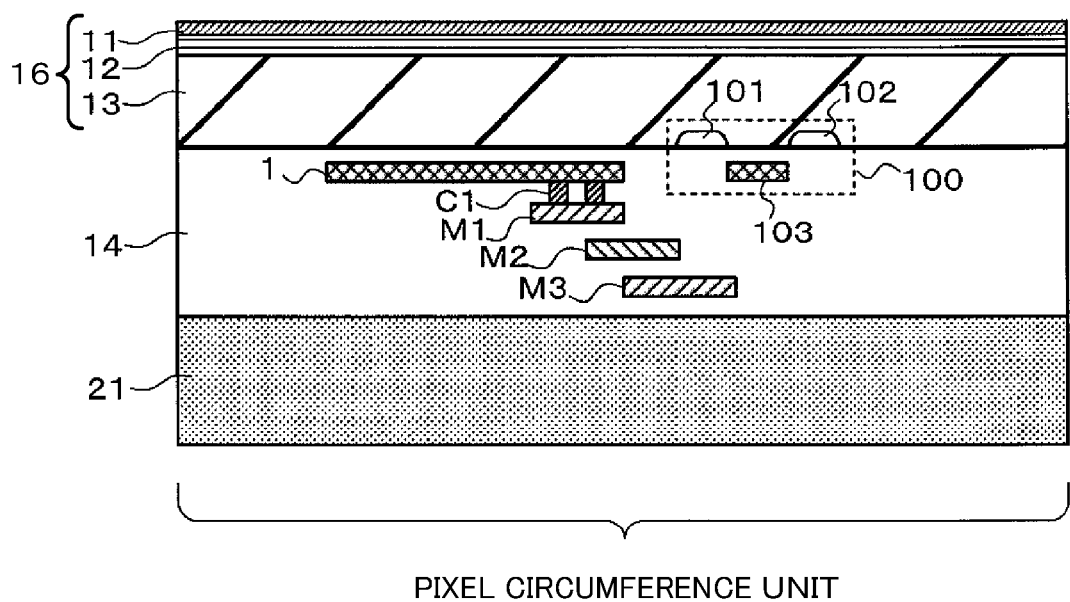

As shown in FIG. 6, after the semiconductor substrate 18 is reversed upside down so that the support substrate 20 faces the bottom, the silicon substrate 10 is removed from the semiconductor substrate 18 by etching. Furthermore, the BOX layer 11 is thinned by etching.

Figure 7:
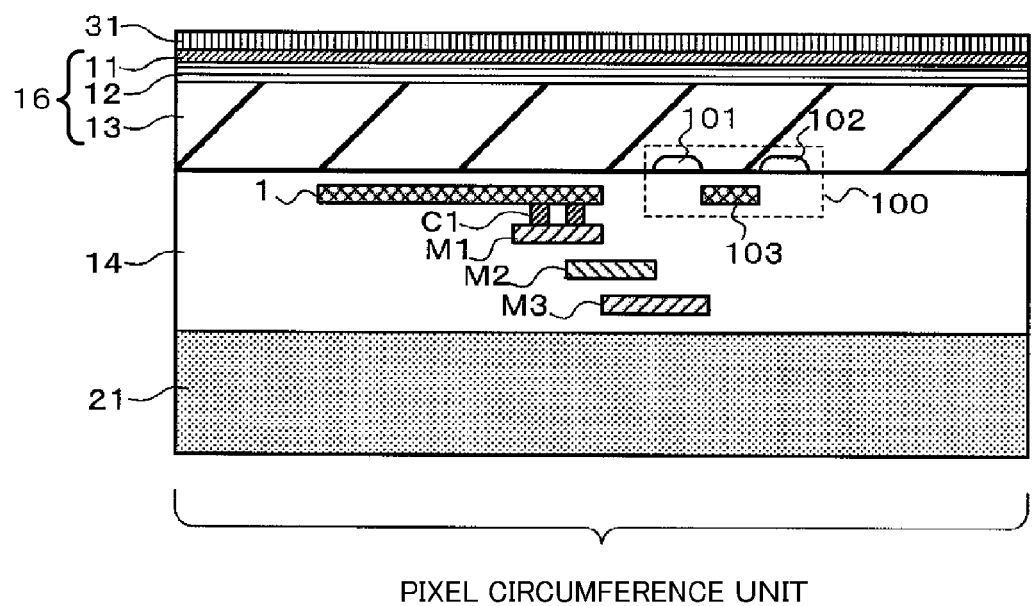

As shown in FIG. 7, the SiN layer 31 is formed on the BOX layer 11 by chemical vapor deposition (CVD) method.

Figure 8:
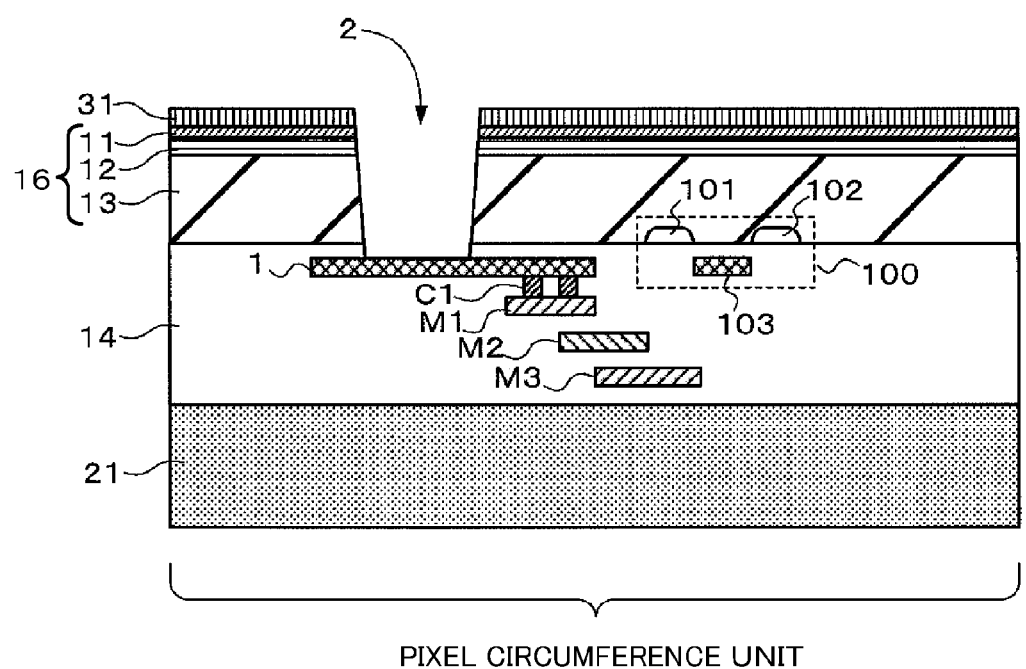

As shown in FIG. 8, holes are made in the SiN layer 31, the BOX layer 11, the p+-type semiconductor layer 12 and the n-type epitaxial layer 13 respectively by anisotropically etching using a gas of fluorine system, so that the via-hole 2 to extend from the back surface 16b side of the semiconductor substrate 16 to the poly silicon electrode 1 is formed.

Figure 9:
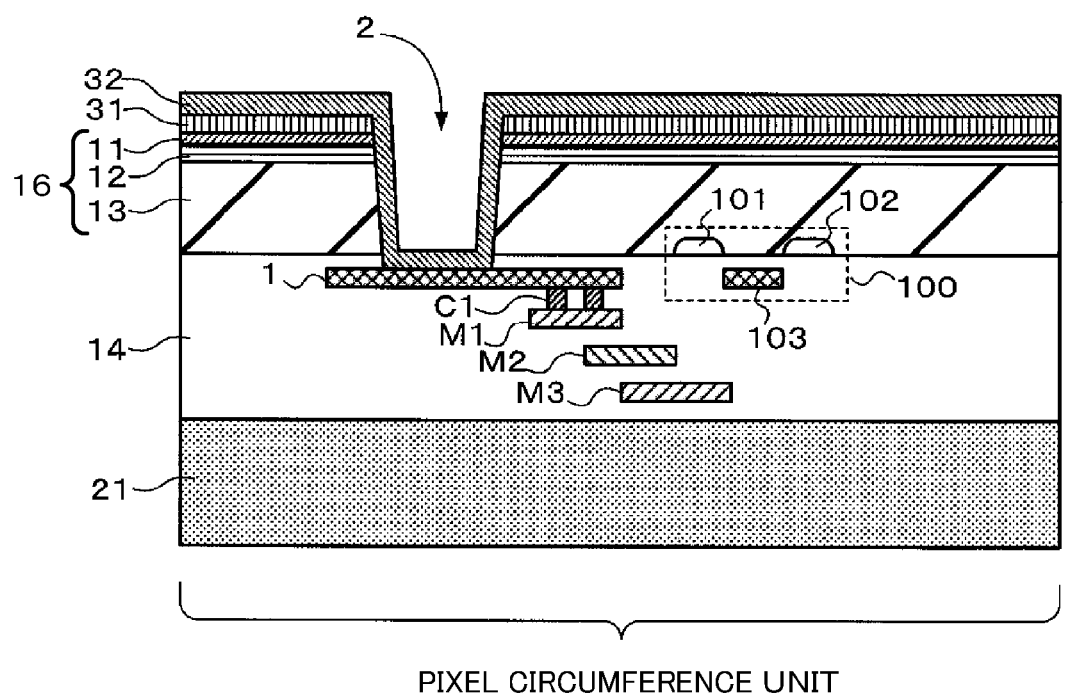

As shown in FIG. 9, the $SiO_2$ layer 32 is formed on the SiN layer 31, the sidewall of the via-hole 2 and the poly silicon electrode 1 exposed on the bottom of the via-hole 2, by CVD method.

Figure 10:
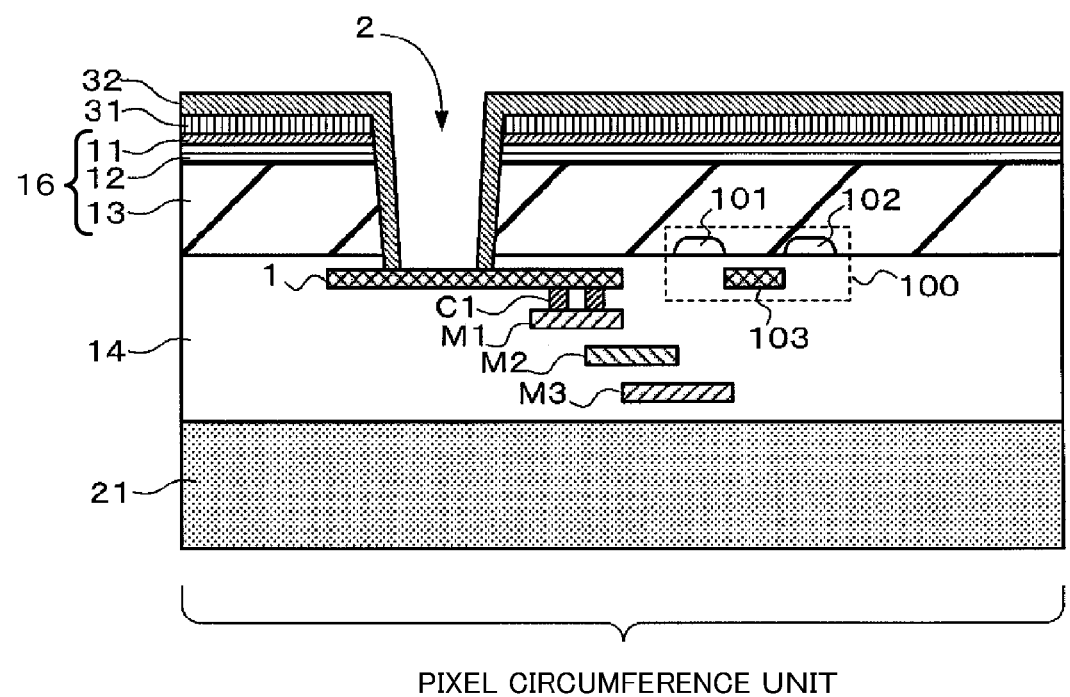

As shown in FIG. 10, the $SiO_2$ layer 32 exposed on the bottom of the via-hole 2 is removed.

Figure 11:
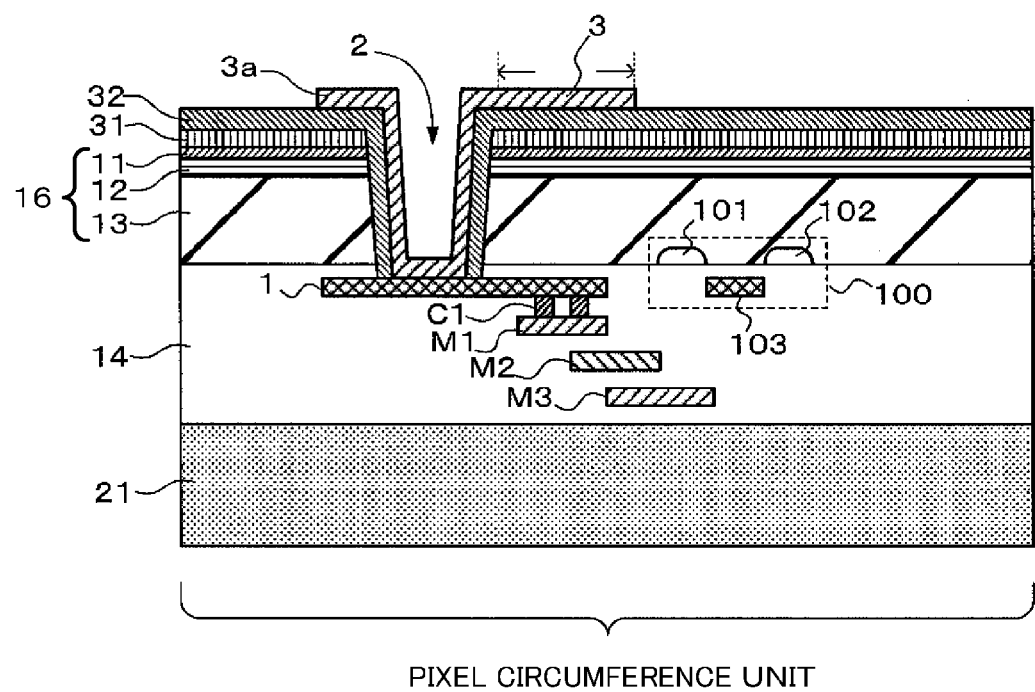

Finally, as shown in FIG. 11, the metal film 3a is deposited on the $SiO_2$ layer 32 which is on the SiN layer 31 and the sidewall of the via-hole 2, and the poly silicon electrode 1 which is exposed on the bottom of the via-hole 2, so that the pad 3 connected to the poly silicon electrode 1 is formed.

As described above, in the first embodiment, the via-hole 2 is dug from the back surface 16b side of the semiconductor substrate 16 so as to extend to the poly silicon electrode 1. Since poly silicon has tolerance to fluorine, the poly silicon electrode 1 is not corroded by fluorine during the formation of the via-hole 2 by dry etching using the gas of fluorine system.

In the first embodiment, since a via-hole which extends to the metal wiring M1 is not formed, the metal wiring M1 is prevented from corroding by dry etching for formation of the via-hole 2.

Also, since the via-hole 2 extends to a poly silicon electrode 1 which is nearer to the back surface 16b side of the semiconductor substrate 16 than the metal wiring M1, it is possible that an etching time becomes short when forming the via-hole 2 because an etching depth becomes shallow.

Second Embodiment

In the first embodiment, the portion to which the via-hole 2 extends is the poly silicon electrode 1. Rather than a conventional case where a portion to which a via-hole extends is a metal wiring, there is concern to which the resistance of the poly silicon electrode 1 to which the via-hole 2 extends becomes higher.

In a second embodiment, an example that the resistance of the poly silicon electrode 1 to which the via-hole 2 extends decreases is shown. The poly silicon electrode 1 is modified into a silicide-formed electrode using silicide technology which decreases resistance of poly silicon.

Figure 12:
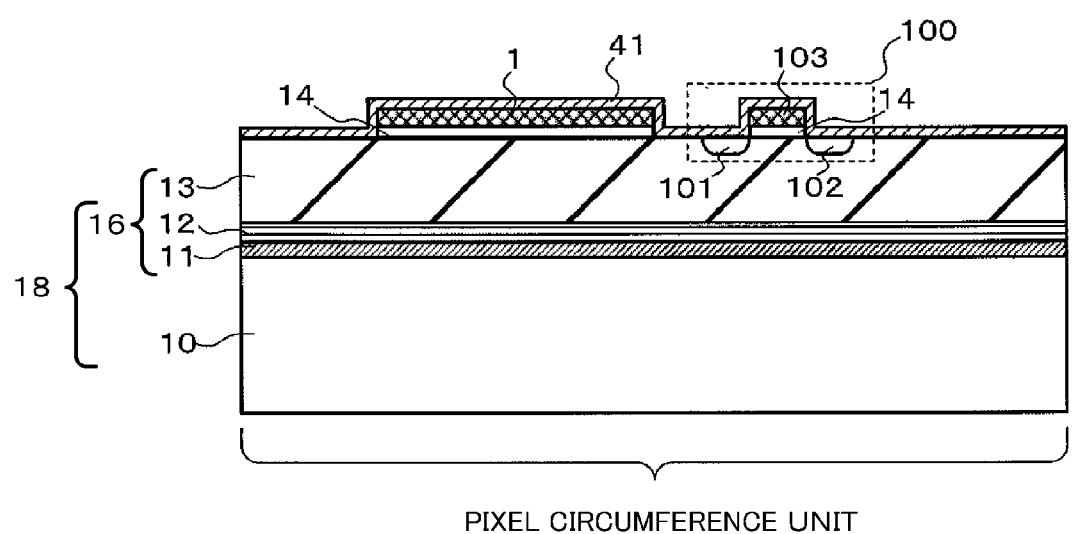
FIGS. 12 and 13 are cross-sectional views showing steps of manufacturing a semiconductor device in sequential order according to a second embodiment.
Figure 13:
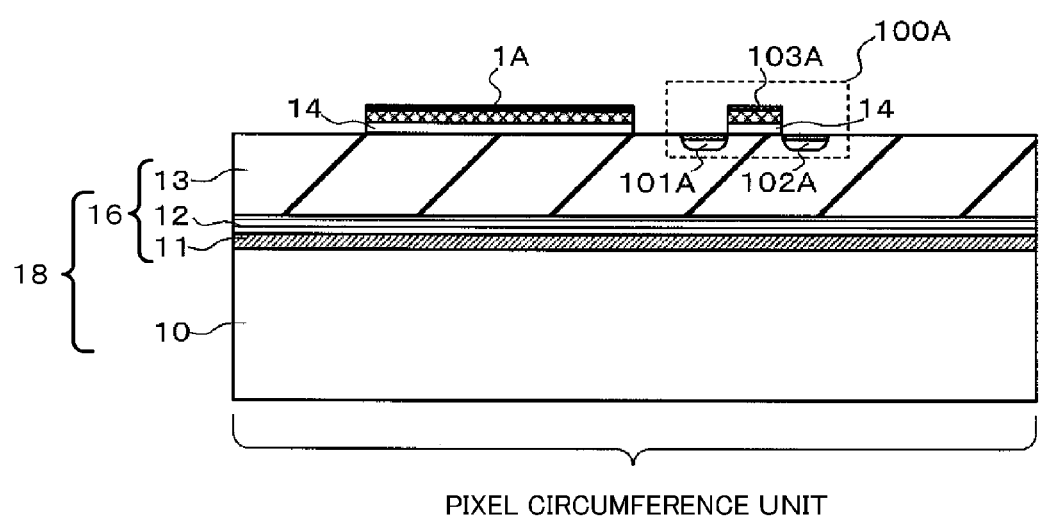

In a second embodiment, steps shown in FIGS. 12 and 13 are added immediately after the step shown in FIG. 2 in order to modify the poly silicon electrode 1 into the silicide-formed electrode.

As described above, in the step shown in FIG. 2, the formation of the ploy silicon electrode 1 and the gate poly silicon electrode 103 on the insulating layer 14 and the formation of the source layer 101 and the drain layer 102 of the MOSFET 100 are performed.

In the second embodiment, after the step shown in FIG. 2, as shown in FIG. 12, a refractory metal film 41 such as titanium (Ti) to conformally cover the front surface 16a side of the semiconductor substrate 16 is formed. The semiconductor substrate 18 is subjected to a heat treatment so that the upper portions of the silicon layers which are in contact with the refractory metal film 41 are selectively modified into silicide layers. Specifically, the portions of the silicon layers which are in contact with the refractory metal film 41 respectively correspond to the poly silicon electrode 1, the gate poly silicon electrode 103, the source layer 101 and the drain layer 102. Then, the unreacted refractory metal film 41 which is not modified into silicide is removed by etching.

FIG. 13 shows the cross-sectional views of the semiconductor substrate 18 after the removal of the unreacted refractory metal film 41. In the second embodiment, the silicide-formed poly silicon electrode 1A in which the upper portion of the poly silicon electrode 1 is modified into the silicide layer is formed as described above.

Moreover, As for MOSFET, a MOSFET 100A having a salicide structure which includes a silicide-formed gate poly silicon electrode 103A, a silicide-formed source layer 101A and a silicide-formed drain layer 102A is formed.

Figure 14:
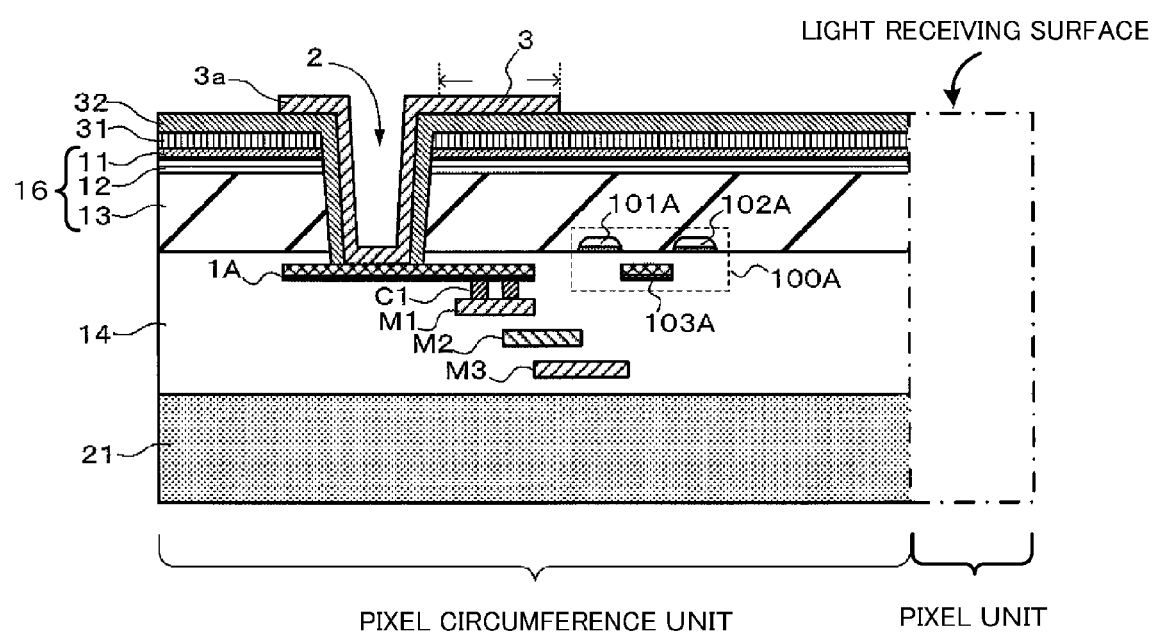
FIG. 14 is a cross-sectional view showing the main portion of the semiconductor device according to the second embodiment.

As well as the first embodiment, the steps shown in FIGS. 3 to 11 are performed after forming the silicide is completed, FIG. 14 is a cross-sectional view showing a semiconductor device of the second embodiment after the manufacturing is completed. As shown in FIG. 14, in the semiconductor device of the second embodiment, the portion to which the via-hole 2 extends is the silicide-formed poly silicon electrode 1A.

In accordance with the second embodiment, since the portion to which the via-hole 2 extends is the silicide-formed poly silicon electrode 1A, it is possible that the resistance of the poly silicon electrode 1 to which the via-hole 2 extends is decreased. Thereby, an increase of a wiring delay at the time of signal transmission, for example can be controlled.

As well as the first embodiment, since the metal wiring M1 is prevented from corroding by dry etching for formation of the via-hole 2 and the depth of the via-hole 2 becomes shallow, it is possible that the etching time becomes short.

As described above, in accordance with at least one embodiment, the metal wiring M1 is prevented from corroding by dry etching for formation of the via-hole 2.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor device including an insulating layer provided on a first surface of a semiconductor substrate which has a second surface opposed to the first surface, a metal wiring provided within the insulating layer and a support substrate bonded to the insulating layer, the semiconductor device comprising:
- a poly silicon electrode connected to the metal wiring through a contact;
- a pad provided on the second surface of the semiconductor substrate and connected to the poly silicon electrode through a metal film deposited in a via-hole to penetrate the semiconductor substrate and extend to the poly silicon electrode; and
- an insulated gate field effect transistor provided with the semiconductor substrate, wherein the insulated gate field effect transistor has a gate poly silicon electrode which is provided within the insulating layer,
- wherein a distance between the poly silicon electrode and the first surface of the semiconductor substrate is the same as a distance between the gate poly silicon electrode and the first surface of the semiconductor substrate.

2. The semiconductor device according to claim 1, wherein the semiconductor substrate is a laminated body made by laminating a silicon oxide film, a semiconductor layer of a p-type conductivity and a semiconductor layer of an n-type conductivity in this order, wherein the first surface of the semiconductor substrate is a surface of the semiconductor layer of the n-type conductivity, and the second surface of the semiconductor substrate is a surface of the silicon oxide film.

3. The semiconductor device according to claim 1, wherein a distance between the semiconductor substrate and the poly silicon electrode is smaller than a distance between the semiconductor substrate and the metal wiring.

4. The semiconductor device according to claim 1, wherein the poly silicon electrode is modified into a silicide-formed electrode.

5. The semiconductor device according to claim 1, further comprising:
- a back-side illumination image sensor having a pixel unit and a pixel circumference unit provided with the semiconductor substrate, the pixel circumference unit including the poly silicon electrode and the pad.

6. The semiconductor device according to claim 5, wherein the pixel unit has a photovoltaic element which converts light entering from a side of the second surface of the semiconductor substrate into an electric signal.

7. The semiconductor device according to claim 5, wherein the poly silicon electrode is modified into a silicide-formed electrode.

8. The semiconductor device according to claim 1, wherein a portion of the insulating layer is sandwiched between the poly silicon electrode and the first surface of the semiconductor substrate, and between the gate poly silicon electrode and the first surface of the semiconductor substrate.

9. The semiconductor device according to claim 8, wherein a thickness of the portion of the insulating layer between the poly silicon electrode and the first surface of the semiconductor substrate is the same as a thickness of the portion of the insulating layer between the gate poly silicon electrode and the first surface of the semiconductor substrate.

* * * * *